United States Patent
Fehrenbacher

(10) Patent No.: US 6,666,901 B1
(45) Date of Patent: Dec. 23, 2003

(54) THERMAL SHOCK RESISTANT QUASICRYSTALLINE ALLOY TARGET

(75) Inventor: Larry Lee Fehrenbacher, Annapolis, MD (US)

(73) Assignee: Technology Assessment & Transfer, Inc., Annapolis, MD (US)

( * ) Notice: Subject to any disclaimer, the term of this patent is extended or adjusted under 35 U.S.C. 154(b) by 90 days.

(21) Appl. No.: 10/005,496

(22) Filed: Nov. 8, 2001

(51) Int. Cl.[7] ............................. C22C 1/04; B22F 3/14
(52) U.S. Cl. ............................ 75/249; 75/228; 419/46; 419/48
(58) Field of Search ....................... 419/46, 48; 75/228, 75/249

(56) References Cited

U.S. PATENT DOCUMENTS 5,409,517 A * 4/1995 Satou et al. .................. 75/228
5,433,978 A * 7/1995 Shield et al. ................ 427/456
5,470,527 A * 11/1995 Yamanobe et al. ........... 419/53
5,733,427 A * 3/1998 Satou et al. ............ 204/298.13

* cited by examiner

Primary Examiner—Daniel J. Jenkins

(57) ABSTRACT

Targets for the fabrication of quasicrystalline films are prepared from powders of the elemental constituents of the objective quasicrystalline material that have been pressed into a required target shape. The temperature of target fabrication is maintained sufficiently low that quasicrystalline alloy formation does not occur during target fabrication. Due to the high thermal shock resistance of each of the individual constituents and due to the dispersed form of the powders comprising the target, the target demonstrates very high resistance to thermal shock.

25 Claims, 1 Drawing Sheet

THERMAL SHOCK RESISTANT QUASICRYSTALLINE ALLOY TARGET

FIELD OF THE INVENTION

The present invention relates to targets useful in the fabrication of thin films of quasicrystalline materials.

BACKGROUND OF THE INVENTION

Quasicrystalline materials constitute a class of alloy materials that possess five-fold or ten-fold symmetry. Earlier research indicates that these materials may exhibit properties that could have many commercial and scientific benefits.

Quasicrystalline materials have been fabricated in bulk form as ingots with dimensions on the order of less than a centimeter on a side. Two of the alloy stoichiometries that have been found to exhibit quasicrystalline properties are $Al_{71.1}Cu_5Fe_{11.3}Cr_{12}$ and $Al_{65}Cu_{23}Fe_{12}$. Numerous other alloy compositions have also been found to exhibit quasicrystalline properties.

Quasicrystalline materials have also been produced as thin films by thermal spray deposition. Films produced in this manner characteristically contain porosity and exhibit a rough surface topography. It is desirable to produce high density, low porosity thin films of these materials for optimal performance. The thin film deposition models suggested herein are presented to aid visualization of the thin film deposition process and are not intended to limit in any way the useful range of the disclosed invention.

In the implementation of any thin film deposition process, energy is applied to a quasicrystalline material or to separate materials comprising the individual atomic constituents of the desired quasicrystalline stoichiometry. This applied energy vaporizes or sputters the target materials. The vaporized or sputtered constituents fill the environment, usually a vacuum vessel, in which the target materials and the substrate to be coated are located. Some fraction of the vaporized or sputtered material which comes into contact with the substrate adheres thereto. In this manner, a thin film of quasicrystalline material develops on the substrate over a period of time as it is exposed to the vaporized or sputtered material(s).

Two methods have generally been used in the deposition of high density, low porosity thin films of quasicrystalline materials. According to the first method a multiplicity of targets are used, each target comprising one constituent of the quasicrystalline alloy being deposited. For example, in order to deposit thin films of the alloy composition $Al_{71.1}Cu_5Fe_{11.3}Cr_{12}$, four distinct targets are used: one entirely aluminum Al, one of copper Cu, one of iron Fe and one of chromium Cr. The substrate is passed in front of each target sequentially for a brief period of time during which the target is ablated by appropriate heavy ion bombardment. Each ablated atomic species then impacts the substrate to which it adheres. The process is repeated until the desired total thin film thickness is achieved.

The difficulty with this method is that the resulting film can evolve into a quasicrystalline film only by the interdiffusion of the individual atoms. Thus, in each pass in front of the set of targets, atoms of the first deposited species must diffuse through the layer deposited by the last deposited species, and atoms of the last deposited species must diffuse through the layer produced by the first deposited species. Thus, the alloy composition and uniformity of the film depends entirely on the success of this interdiffusion process. This process has only been successfully used for very thin quasicrystalline films on the order of 300 nanometers or less because of interdiffusion issues with layers and substrate elements.

In the second method, the source of ablated or vaporized material is a solid ingot or plate of quasicrystalline material possessing the stoichiometry of the desired thin film. Energy may be applied from a thermal source, laser source or by impact from ions of an inert material such as argon or xenon. Laser energy sources have not been used extensively. Impact by ablating ions can be achieved by means of conventional ion sources or by magnetron sputtering. In the latter method, argon ions or other heavy ions such as xenon are accelerated to high energies and impact the quasicrystalline target thereby transferring both energy and momentum from the ions to the target material in accordance with the conservation laws of physics. The momentum and energy acquired by the quasicrystalline target material is chosen to be sufficient to free individual alloy atoms or particles from the quasicrystalline target. These atoms or particles then traverse the intervening space between the target and the substrate. Upon impact with the substrate, momentum and energy is exchanged with the substrate. In this manner, a film of the quasicrystalline material develops on the substrate over a period of time.

It has been observed, however, that energy transferred to the quasicrystalline target from the incident ions results in local heating of the target. Unfortunately, bulk quasicrystalline materials such as target ingots are extremely brittle. Therefore, in all experiments performed with this technique to date, this localized heating has produced a thermal shock that causes the target to fracture making it unusable for further thin film deposition. This low thermal shock resistance of quasicrystalline materials is an inherent property of all such alloy compositions.

Thus, the prior art has yet to present a satisfactory method for the deposition of thin films of quasicrystalline alloy materials directly from quasicrystalline alloy materials.

OBJECT OF THE INVENTION

It is therefore an object of the present invention to provide a method for the deposition of quasicrystalline films directly from improved and novel target materials.

It is another object of the present invention to provide improved targets for the formation of quasicrystalline films that do not exhibit the thermal shock sensitivity of prior art such targets.

It is yet a further object of the present invention to provide a method for the fabrication of targets for the production of quasicrystalline thin films.

SUMMARY OF THE INVENTION

According to the present invention, targets for the fabrication of quasicrystalline films are prepared from powders of the elemental constituents of the objective quasicrystalline material that have been pressed into a required target shape. The temperature of target fabrication is maintained sufficiently low that quasicrystalline alloy formation does not occur. Due to the high thermal shock resistance of each of the individual constituents and due to the dispersed form of the powders comprising the target, the target demonstrates very high resistance to thermal shock.

DESCRIPTION OF THE DRAWING

The FIGURE is a schematic representation of the process of the present invention with required steps being represented by solid lines and optional steps, as described hereinafter, being represented by dotted lines.

DETAILED DESCRIPTION

Figure 1:
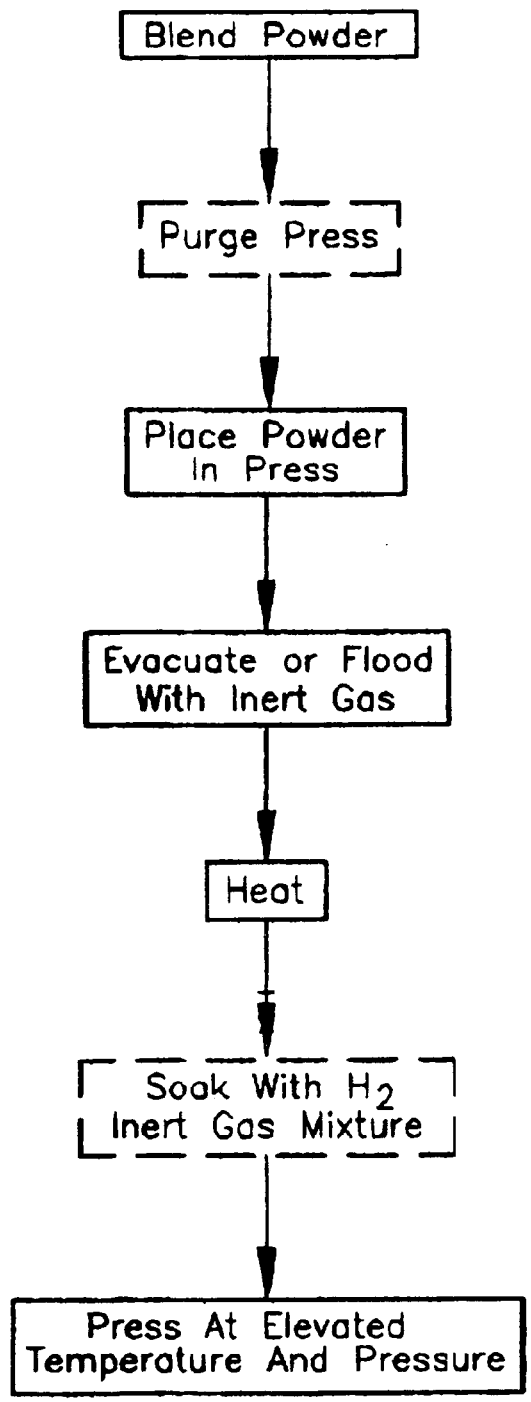

According to the present invention, there is described what is in effect a third method for the thin film deposition of quasicrystalline materials. The essence of the present invention is the fabrication and availability of dense elemental targets whose starting compositions can be adjusted to account for differences in the sputtering rates of the various elements and an inherent resistance to thermal shock. As described above, thermal shock posed a significant shortcoming to the prior art such techniques and target materials.

Referring now to the FIGURE, the method of the present invention comprises: 1) blending powders of the individual elemental constituents of the objective target in ratios determined as described below; 2) optionally purging a vacuum hot press chamber and die with an oxide reducing gas mixture; 3) placing the blended powder into the die of the vacuum hot press; 4) evacuating the vacuum hot press or flooding the vacuum hot press with an inert gas or a mixture of an inert gas and a small volume percent of hydrogen; 5) heating the vacuum hot press containing the powder; 6) optionally soaking the contained powder at an elevated temperature in the presence of a mixture of an inert gas and hydrogen to remove oxides that may be present in the powder; and 7) hot pressing the powder at elevated temperature and pressure to form the objective target.

According to the present invention, a target for the fabrication of quasicrystalline thin films is fabricated from pure powders of the elemental constituents that have been pressed into the required target shape. The temperature during the pressing operation is maintained sufficiently low that a quasicrystalline alloy is not formed. Due to the high thermal shock resistance of each constituent and due to the dispersed form of the powders comprising the target, the target exhibits very high resistance to thermal shock.

The target comprises a selection of the constituent atoms whose probability of ablation is predetermined by the relative sputtering or ablation rate of each of the specie atoms. Therefor, a target can be fabricated which, when impacted by heavy ions, will selectively ablate or sputter to deposit a preselected quasicrystalline stoichiometry. The ablation rate for each elemental specie is different. For example, theoretical calculations indicate that the ablation rate for aluminum is 1.0, for copper it is 2.0 and for iron it is 0.8 where all units are the number of atoms ablated for every argon ion that impacts the surface where the energy of the argon ion is 500 eV (electron volts). These ablation rates usually are not precisely realized in practice, and constitute an initial estimate, while the actual rate can only be determined by experimentation and trial and error.

A typical example can be shown by an analysis of testing to fabricate a target designed to deposit a thin film of the composition $Al_{65}Cu_{23}Fe_{12}$. Due to differences in ablation rates, the relative atomic target composition should be 65/1 for aluminum, 23/2 for copper and 12/.08 for iron, all normalized to aluminum. This would require a target of the following stoichiometry: $Al_{65}Cu_{14.3}Fe_{18.7}$. Experimentation has shown that resputter of aluminum from a target substrate during deposition on negatively biased substrates as described below reduces that amount of aluminum that remains on the substrate. The net result is that the relative mount of aluminum in the target material must be increased to accommodate this factor. Consequently, it has been determined that the best stoichiometry for this type of deposition is $Al_{65}Cu_{9.6}Fe_{5.6}$.

Once the correct stoichiometry has been determined, fabrication of the appropriate target to achieve that stoichiometry may begin. The component materials are mixed as powders by ball milling, V-blending or otherwise as appropriate, and introduced into the die of a press. Pressing under the conditions described below has been successfully accomplished at room temperature in air and in an open press at pressures of between about 10,000 and 20,000 psi. Physical vapor deposition targets fabricated in this fashion have been used successfully in magnetron sputtering to produce quasicrystalline thin films on a variety of substrates. Because of the limited ductility of the elemental materials at room temperature only relatively thin targets, on the order of a millimeter or less, could be fabricated in this fashion. As a consequence, fabrication of the targets of the present invention is preferably accomplished in a vacuum hot press.

Vacuum hot pressing to obtain the targets of the present invention involves placing a well blended mixture of the elemental powders into the die of the press, evacuating the press chamber to a low pressure, on the order of about $1 \times 10^{-6}$ Torr and then maintaining the vacuum during hot pressing or flooding the chamber with an inert gas such as argon or helium. In the latter case, hot pressing can be accomplished at or near atmospheric pressure. The temperature of the die is then raised to between about 250° C. and 500° C. and preferably between about 300° C. and 450° C. to increase the ductility of the powders and to permit the fabrication of targets up to one-quarter inch in thickness. The temperature should be maintained below about 500° C., as above this temperature there is significant risk that the constituents will undergo a phase change to form a quasicrystalline solid, that would be susceptible to thermal shock during use. Pressure is then applied to the compact at a level of between about 2500 and 20,000 psi, preferably between about 2500 and 10,000 psi, and maintained for a period of at least two hours. The application of these pressures for periods shorter than about 2 hours does not always produce a satisfactory "binding" of the powder components. Maintenance of the pressure at these levels beyond the two hour minimum does not appear to adversely affect the character and properties of the target. Quite obviously, since high temperature ductility is the goal of the fabrication operation there is a tradeoff between pressure and temperature, with one being capable of reduction as the other increases and vice versa. This procedure has been successfully used to produce ¼"×3½"×8" quasicrystalline targets that are shock resistant and demonstrate long useful lives. This technique permits the fabrication of shock resistant alloy targets of virtually any size, thus allowing the production of practically sized components to be coated with virtually any desired thickness of quasicrystalline material.

While a wide variety of powders can be used in the successful practice of the present invention, it is desirable that each of the individual elemental powders be of relatively the same particle size to assure uniform ablation. Powders of particle sizes between about $1\mu$ and about $10\mu$, and preferably between about $1\mu$ and about $5\mu$ in particle size are specifically preferred for application in the process of the instant invention. Particle sizes below this range are extremely difficult to handle and at levels above these ranges, relatively non-uniform ablation may result.

As a precautionary and quality enhancing measure and to minimize the level of oxides present in any fabricated product, it is desirable to purge the die cavity and the vacuum chamber with a mixture of inert gas such as argon or helium containing from about 1 to about 5% by volume of hydrogen at a temperature of between about 300° C. and about 400° C. to remove any adsorbed oxygen from the wall of the containers before processing. According to a highly preferred embodiment of the present invention, after loading of the appropriately mixed powders into the press die and reducing the internal pressure thereof as described hereinabove, the chamber is purged with the foregoing hydrogen/inert gas mixture at the prescribed temperature and held under these conditions for a period of at least four hours without the application of pressure. This procedure reduces some of the oxide present in the powders and also oxides that may be formed during processing. Any water formed during this reduction step is volatile and will escape from the target. The depth of oxide removal from the powder surfaces will, of course depend upon the temperature applied, the time period during which this condition is maintained, the nature of the individual oxides, the porosity of the target before and during pressing and other diffusion limitations for hydrogen into the powder/compact and water out of the compact. Alternatively, or in combination with the foregoing purge/oxide reduction procedure, the entire pressing operation can be conducted under an atmosphere of the prescribed hydrogen/inert gas mixture. All of these latter steps are aimed at improving the quality and uniformity of the target and to insure consistency and repeatability of the target fabrication process and ultimately the quasicrystalline thin film deposition process.

In use, the quasicrystalline thin film producing targets of the present invention are used in the same fashion as other similar prior art such targets, but with the capability of longer life and more robust resistance to thermal shock due to their unique physical state as uniform compacted powders rather than brittle quasicrystalline materials.

As the invention has been described, it will be apparent to those skilled in the art that the same may be varied in many ways without departing from the spirit and scope of the invention. Any and all such modifications are intended to be included within the scope of the appended claims.

What is claimed is:

1. A method for the fabrication of a target useful in the production of quasicrystalline alloy thin films comprising:
    A) blending powders of the individual elemental constituents of the quasicrystalline alloy to form a powder blend;
    B) placing the powder blend into a vacuum press;
    C) evacuating the vacuum press or flooding the vacuum press with inert gas or a mixture of inert gas and from about 1 to about 5 percent by volume of hydrogen;
    D) heating the powder blend in the vacuum press to a temperature of between about 250° C. to about 500° C. to form a heated powder blend; and
    E) applying pressure of between about 2500 psi and about 20,000 psi to the heated powder blend for a period of at least two hours.

2. The method of claim 1 including the further step of purging the vacuum press with a mixture of inert gas and from about 1% to about 5% by volume of hydrogen prior to placing of the powder blend into the press.

3. The method of claim 1 wherein subsequent to placement of the powder blend into the vacuum press, the vacuum press is flooded with a mixture of an inert gas and from about 1% to about 5% by volume of hydrogen, and the powder blend is held at a temperature of between about 250° C. and about 500° C. for at least four hours prior to the application of pressure in step D.

4. The method of claim 3 wherein the powder blend is held at a temperature of between about 300° C. and about 400° C.

5. The method of claim 1 wherein the powders comprising each of the individual elemental constituents are of relatively the same size and comprise individual particles ranging in size from about $1\mu$ to about $10\mu$.

6. The method of claim 5 wherein said particles range in size from about $1\mu$ to about $5\mu$.

7. The method of claim 1 wherein the heating in D is to a temperature of between about 300° C. and about 450° C.

8. The method of claim 1 wherein the proper ratio of the elemental constituents for the blending of the powders in A is first determined by experimental fabrication and use of targets comprising variations in the ratios of the appropriate elemental constituents.

9. The method of claim 1 wherein said pressure in D is applied at a level of between about 2500 psi and about 10,000 psi.

10. A method for the fabrication of a target useful in the production of quasicrystalline alloy thin films comprising:
    A) blending powders of individual elemental constituents of the quasicrystalline alloy having a particle size of between about $1\mu$ and about $10\mu$ to form a powder blend;
    B) placing the powder blend into a vacuum press;
    C) evacuating the vacuum press to a pressure of about $1\times10^{-6}$ Torr;
    D) heating the powder blend in the vacuum press to a temperature of between about 300° C. to about 400° C. to form a heated powder blend; and
    E) applying pressure of between about 2500 psi and about 10,000 psi to the heated powder blend for a period of at least two hours.

11. A target useful in the production of quasicrystalline alloy thin films comprising an appropriately formulated, compacted blend of powders of the individual elemental constituents of the quasicrystalline alloy.

12. The target of claim 11 wherein said powders are comprised of particles in the range of from about $1\mu$ to about $10\mu$.

13. The target of claim 12 wherein said particles are in the range of from about $1\mu$ to about $5\mu$.

14. A method for the production of a target useful in the production of quasicrystalline alloy thin films comprising compressing powders of the individual elemental constituents of the quasicrystalline alloy at pressures ranging from about 10,000 psi to about 20,000 psi.

15. In a method for the production of quasicrystalline alloy thin films comprising the ablation of a target, the improvement comprising the use of a target produced by the compaction of powders of the individual elemental constituents of the quasicrystalline alloy at pressures ranging from about 10,000 psi to about 20,000 psi.

16. The method of claim 14 wherein said powders range in particle size from about $1\mu$ to about $10\mu$.

17. The method of claim 14 wherein said target is produced by a process comprising:
    A) blending powders of the individual elemental constituents of the quasicrystalline alloy to form a powder blend;
    B) placing the powder blend into a vacuum press;
    C) evacuating the vacuum press or flooding the vacuum press with inert gas or a mixture of inert gas and from about 1 to about 5 percent by volume of hydrogen;
    D) heating the powder blend in the vacuum press to a temperature of between about 250° C. to about 500° C. to form a heated powder blend; and
    E) applying pressure of between about 2500 psi and about 20,000 psi to the heated powder blend for a period of at least two hours.

18. The method of claim 17 including the further step of purging the vacuum press with a mixture of inert gas and from about 1% to about 5% by volume of hydrogen prior to placing of the powder blend into the press.

19. The method of claim 17 wherein subsequent to placement of the powder blend into the vacuum press, the vacuum press is flooded with a mixture of an inert gas and from about 1% to about 5% by volume of hydrogen, and the powder blend is held at a temperature of between about 250° C. and about 500° C. for at least four hours prior to the application of pressure in step D.

20. The method of claim 19 wherein the powder blend is held at a temperature of between about 300° C. and about 400° C.

21. The method of claim 17 wherein the powders comprising each of the individual elemental constituents are of relatively the same size and comprise individual particles ranging in size from about $1\mu$ to about $10\mu$.

22. The method of claim 21 wherein said particles range in size from about $1\mu$ to about $5\mu$.

23. The method of claim 17 wherein the heating in D is to a temperature of between about 300° C. and about 450° C.

24. The method of claim 17 wherein the proper ratio of the elemental constituents for the blending of the powders in A is first determined by experimental fabrication and use of targets comprising variations in the ratios of the appropriate elemental constituents.

25. The method of claim 17 wherein said pressure in D is applied at a level of between about 2500 psi and about 10,000 psi.

* * * * *